(12) United States Patent
Sato et al.

(10) Patent No.: US 11,749,589 B2
(45) Date of Patent: Sep. 5, 2023

(54) MODULE

(71) Applicant: Murata Manufacturing Co., Ltd., Nagaokakyo (JP)

(72) Inventors: Kazushige Sato, Nagaokakyo (JP); Masayoshi Takagi, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 305 days.

(21) Appl. No.: 17/327,821

(22) Filed: May 24, 2021

(65) Prior Publication Data

US 2021/0280503 A1 Sep. 9, 2021

Related U.S. Application Data

(63) Continuation of application No. PCT/JP2019/042560, filed on Oct. 30, 2019.

(30) Foreign Application Priority Data

Nov. 30, 2018 (JP) .................................. 2018-225583

(51) Int. Cl.
*H01L 23/522* (2006.01)
*H01L 23/498* (2006.01)
(Continued)

(52) U.S. Cl.
CPC .... *H01L 23/49811* (2013.01); *H01L 23/3121* (2013.01); *H01L 23/3185* (2013.01);
(Continued)

(58) Field of Classification Search
CPC .. H01L 23/552; H01L 23/49822; H01L 24/48
See application file for complete search history.

(56) References Cited

U.S. PATENT DOCUMENTS 9,793,222 B1* 10/2017 Lee ................... H01L 23/49838
2009/0194852 A1* 8/2009 Chiu ....................... H01L 21/568
257/E23.114
(Continued)

FOREIGN PATENT DOCUMENTS

JP 2010-040689 A 2/2010
WO 2008/093414 A1 8/2008
(Continued)

OTHER PUBLICATIONS

Official Communication issued in International Patent Application No. PCT/JP2019/042560, dated Jan. 28, 2020.

*Primary Examiner* — Michele Fan
(74) *Attorney, Agent, or Firm* — KEATING & BENNETT, LLP

(57) ABSTRACT

A module includes: a substrate including a first main surface; a first component mounted on the first main surface; a first land electrode provided on the first main surface; a first mold resin that covers at least the first main surface and the first component; a top surface shield film that covers a top surface of the first mold resin; a side surface shield film that covers a side surface of the first mold resin; a first conductor pillar provided in the first mold resin to electrically connect the first land electrode and the top surface shield film; and an upper first bypass conductor provided in the first mold resin to electrically connect the top surface shield film and the side surface shield film.

15 Claims, 16 Drawing Sheets

(51) Int. Cl.
*H01L 23/31* (2006.01)
*H01L 23/60* (2006.01)
*H01L 25/065* (2023.01)
*H01L 23/00* (2006.01)

(52) U.S. Cl.
CPC ........ *H01L 23/49822* (2013.01); *H01L 23/60* (2013.01); *H01L 25/0657* (2013.01); *H01L 24/16* (2013.01); *H01L 24/48* (2013.01); *H01L 2224/16225* (2013.01); *H01L 2224/48225* (2013.01)

(56) References Cited

U.S. PATENT DOCUMENTS

| | | |
|---|---|---|
| 2009/0236700 A1 | 9/2009 | Moriya |
| 2016/0172309 A1* | 6/2016 | Gong .................... H01L 23/552 |
| | | 257/659 |
| 2017/0317002 A1 | 11/2017 | Kitahara et al. |
| 2019/0067208 A1* | 2/2019 | Lin ...................... H01L 23/552 |
| 2019/0273312 A1 | 9/2019 | Otsubo |
| 2020/0008325 A1 | 1/2020 | Otsubo |
| 2020/0323077 A1* | 10/2020 | Han ...................... H05K 1/0216 |

FOREIGN PATENT DOCUMENTS

| | | |
|---|---|---|
| WO | 2013/035716 A1 | 3/2013 |
| WO | 2016/117196 A1 | 7/2016 |
| WO | 2018/101384 A1 | 6/2018 |
| WO | 2018/164159 A1 | 9/2018 |

\* cited by examiner

MODULE

CROSS REFERENCE TO RELATED APPLICATIONS

This application claims the benefit of priority to Japanese Patent Application No. 2018-225583 filed on Nov. 30, 2018 and is a Continuation Application of PCT Application No. PCT/JP2019/042560 filed on Oct. 30, 2019. The entire contents of each application are hereby incorporated herein by reference.

BACKGROUND OF THE INVENTION

1. Field of the Invention

The present invention relates to a module.

2. Description of the Related Art

One example of a circuit module is described in Japanese Patent Laid-Open No. 2010-40689. The circuit module is provided with a sealing resin layer that seals an element component group. A top surface and a side surface of the sealing resin layer are integrally covered with a coating resin layer made of a conductive resin. When the coating resin layer is formed on the sealing resin layer, a thickness of the coating resin layer becomes thin at a corner portion, which leads to insufficient reliability of electrical connection. In order to deal with the above-described problem, a step is provided in the sealing resin layer.

One example of a method of manufacturing a module is described in WO 2013/035716. In WO 2013/035716, a metal plate having a prescribed shape is subjected to bending processing to thereby obtain a terminal assembly, and the terminal assembly is mounted on a wiring board having an electronic component mounted thereon, and resin sealing is performed. Thereafter, a part of the terminal assembly is removed to thereby obtain an interlayer connecting conductor.

In order to obtain the configuration described in Japanese Patent Laid-Open No. 2010-40689, special processing for providing the step at the corner portion of the sealing resin layer is needed, which results in an increase in manufacturing steps. In addition, processing for accurately providing the step is difficult.

By using the configuration described in WO 2013/035716, the interlayer connecting conductor can be obtained. However, the problem of insufficient reliability of electrical connection between a top surface and a side surface of a shield film cannot be dealt with.

SUMMARY OF THE INVENTION

Preferred embodiments of the present invention provide modules that each provide reliable electrical connection for a shield film.

A module according to a preferred embodiment of the present invention includes a substrate including a first main surface; a first component mounted on the first main surface; a first land electrode on the first main surface; a first mold resin that covers at least the first main surface and the first component; a top surface shield film that covers a top surface of the first mold resin; a side surface shield film that covers a side surface of the first mold resin; a first conductor pillar in the first mold resin to electrically connect the first land electrode and the top surface shield film; and an upper first bypass conductor in the first mold resin to electrically connect the top surface shield film and the side surface shield film.

The modules according to preferred embodiments of the present invention each include the upper first bypass conductor, and thus, the modules are each able to provide reliable electrical connection between the top surface and the side surface of the shield film. That is, the modules are each able to provide reliable electrical connection for the shield film.

The above and other elements, features, steps, characteristics, and advantages of the present invention will become more apparent from the following detailed description of the preferred embodiments with reference to the attached drawings.

DETAILED DESCRIPTION OF THE PREFERRED EMBODIMENTS

The dimension ratio shown in each of the figures does not always faithfully show the actual dimension ratio, but may show the dimension ratio in an exaggerated manner for the sake of explanation. In the following description, the concept "upper" or "lower" does not necessarily indicate an absolute upper or lower position, but may indicate a relatively upper or lower position in the posture shown in each figure.

First Preferred Embodiment

Figure 1:
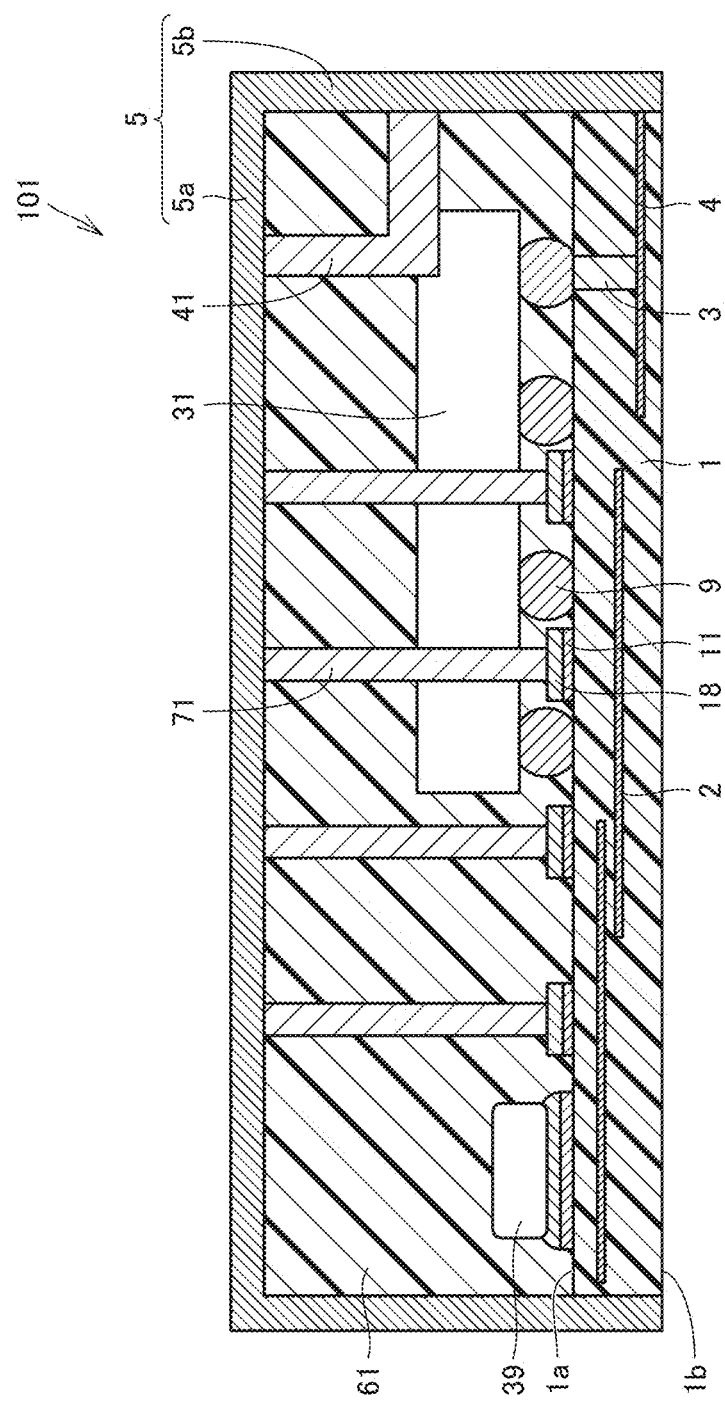
FIG. 1 is a cross-sectional view of a module according to a first preferred embodiment of the present invention.

A module according to a first preferred embodiment of the present invention will be described with reference to FIG. 1. FIG. 1 shows a cross-sectional view of a module 101 according to the present preferred embodiment.

In FIG. 1, components that are not able to be simultaneously seen when module 101 is cut along one cross section are also shown simultaneously in one cross-sectional view for the sake of explanation. For example, a first component 31, components 39, solder balls 9 and the like are located on the back side of the sheet relative to first conductor pillars 71 and an upper first bypass conductor 41. Therefore, when module 101 is cut along a cross section passing through first conductor pillars 71 and upper first bypass conductor 41, first component 31, components 39, solder balls 9 and the like are hidden by a first mold resin 61 and are not able to be seen. However, first component 31, components 39, solder balls 9 and the like are also shown in FIG. 1 for the sake of explanation. This way of showing the components is applied as well to the following cross-sectional views.

Module 101 according to the present preferred embodiment includes a substrate 1 including a first main surface 1a, first component 31 mounted on first main surface 1a, first land electrodes 11 provided on first main surface 1a, first mold resin 61 that covers at least first main surface 1a and first component 31, a top surface shield film 5a that covers a top surface of first mold resin 61, a side surface shield film 5b that covers a side surface of first mold resin 61, first conductor pillars 71 provided in first mold resin 61 to electrically connect first land electrodes 11 and top surface shield film 5a, and upper first bypass conductor 41 provided in first mold resin 61 to electrically connect top surface shield film 5a and side surface shield film 5b.

In addition to first main surface 1a, substrate 1 includes a second main surface 1b that is opposite to first main surface 1a. Substrate 1 may be a multilayer substrate, for example. Substrate 1 may be a resin multilayer substrate, or may be a ceramic multilayer substrate, for example. Internal conductor patterns 2 are built into substrate 1. As one type of internal conductor patterns 2, an internal GND electrode 4 is built into substrate 1. An end surface of internal GND electrode 4 is exposed on a side surface of substrate 1. Internal GND electrode 4 is electrically connected to side surface shield film 5b at the end surface. Within substrate 1, a conductor via 3 is electrically connected to internal GND electrode 4.

First component 31 is mounted on first main surface 1a of substrate 1 with a plurality of solder bumps 9 provided therebetween. Each of components 39 is mounted on first main surface 1a of substrate 1. First component 31 may be, for example, a PA (Power Amplifier), an LNA (Low Noise Amplifier), an SW-IC (Switch IC), a RF-IC (High Frequency IC), a BB-IC (Baseband IC), an SAW filter or the like. A method of mounting first component 31 is not limited to bump mounting. First component 31 may be, for example, wire-bond mounted. Each of components 39 may be, for example, an SMD (Surface Mount Device) such as, for example, a capacitor or an inductor, that is, a surface mount component. Each of components 39 may be solder mounted.

Each of first conductor pillars 71 and upper first bypass conductor 41 is made of, for example, Cu, a Cu—Fe alloy, or the like. Each of first conductor pillars 71 is electrically connected to first land electrode 11 provided on first main surface 1a of substrate 1, with solder 18 provided therebetween. Each of first conductor pillars 71 and upper first bypass conductor 41 has a plate shape. Upper first bypass conductor 41 is spaced apart from first main surface 1a. First mold resin 61 is made of, for example, an epoxy resin.

A shield film 5 includes top surface shield film 5a and side surface shield film 5b. Side surface shield film 5b covers not only the side surface of first mold resin 61 but also the side surface of substrate 1. As shown in FIG. 1, top surface shield film 5a and side surface shield film 5b are integrally provided.

Module 101 according to the present preferred embodiment includes upper first bypass conductor 41 provided in first mold resin 61 to electrically connect top surface shield film 5a and side surface shield film 5b. Therefore, module 101 is able to provide a reliable electrical connection between the top surface and the side surface of the shield film. That is, module 101 is able to provide a reliable electrical connection for the shield film.

Shield film 5 is also able to be grounded by connection between internal GND electrode 4 and side surface shield film 5b on the side surface of substrate 1. However, this provides only a small contact area, which leads to insufficient reliability. However, in the present preferred embodiment, top surface shield film 5a and substrate 1 are able to be electrically connected by first conductor pillars 71. Therefore, by preparing a GND electrode on first main surface 1a of substrate 1, top surface shield film 5a is able to be easily grounded through any of first conductor pillars 71.

A distance between upper first bypass conductor 41 and first component 31 is shorter than a distance between shield film 5 and first component 31. Therefore, heat generated from first component 31 is able to be transmitted through upper first bypass conductor 41, and thus, the heat is able to be released more efficiently. More specifically, the heat generated from first component 31 is able to be transmitted from first component 31 through first mold resin 61 to upper first bypass conductor 41, and further, transmitted from upper first bypass conductor 41 through shield film 5 to substrate 1. The heat is released from substrate 1 to the outside. Since the heat transmitted to upper first bypass conductor 41 is also able to be transmitted from upper first bypass conductor 41 to first mold resin 61, the heat release is promoted. A thermal conductivity of upper first bypass conductor 41 is preferably higher than a thermal conductivity of first mold resin 61, for example.

The feature of promoting the heat release as described above is applied not only to upper first bypass conductor 41 shown here, but also to the bypass conductors as a whole described in the following other preferred embodiments. That is, the advantageous effect of promoting the heat release as described above is also provided in the following other preferred embodiments.

A non-limiting example of a method of manufacturing module 101 according to the present preferred embodiment will be described below.

Figure 2:
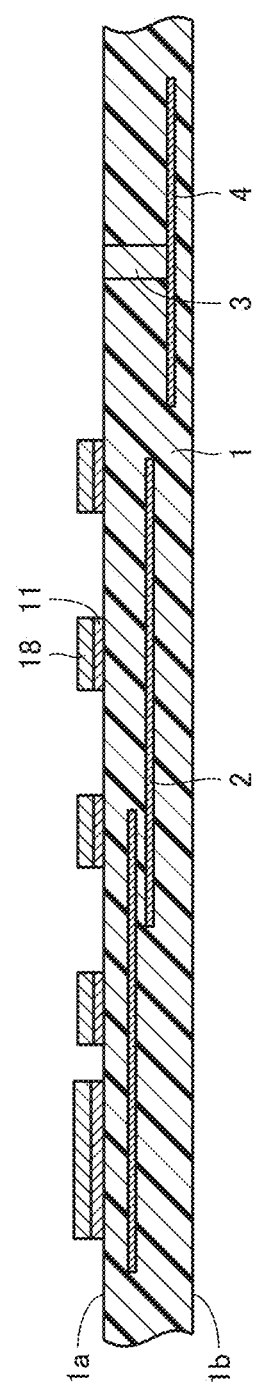
FIG. 2 is an explanatory diagram of a first step of a method of manufacturing the module according to the first preferred embodiment of the present invention.
Figure 3:
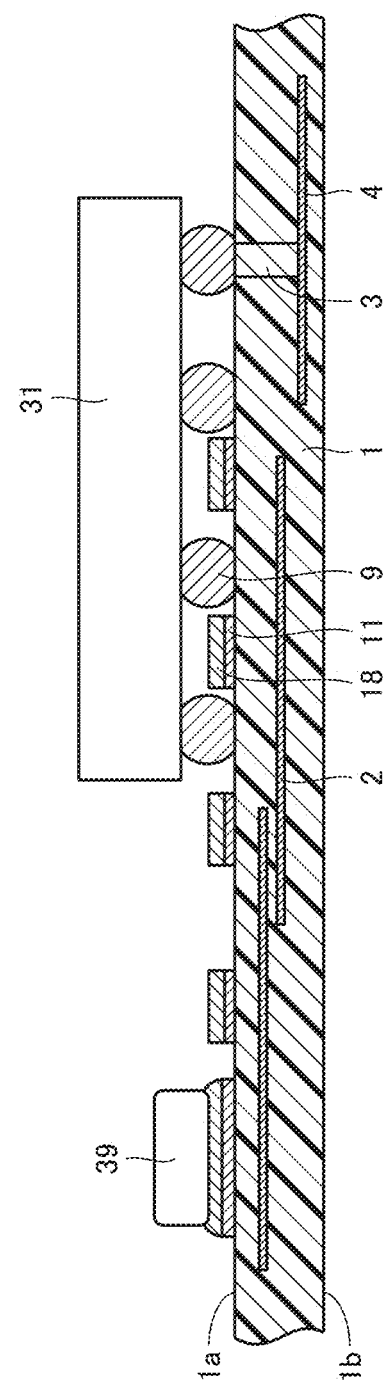
FIG. 3 is an explanatory diagram of a second step of the method of manufacturing the module according to the first preferred embodiment of the present invention.

First, as shown in FIG. 2, first land electrodes 11 are formed on first main surface 1a of substrate 1 and solder 18 is provided on a top surface of each first land electrode 11. Substrate 1 includes internal conductor patterns 2 and conductor via 3 built thereinto. As shown in FIG. 3, components 39 and first component 31 are mounted on first main surface 1a.

Figure 4:
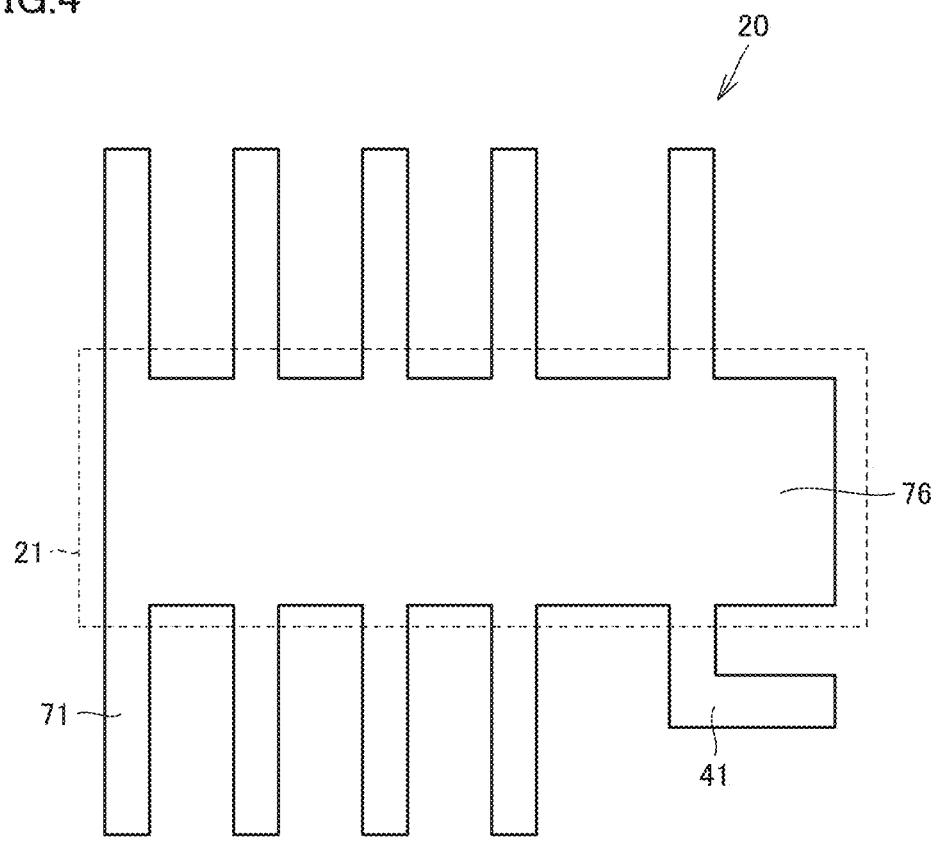
FIG. 4 is a plan view of a structure included in the method of manufacturing the module according to the first preferred embodiment of the present invention.

As shown in FIG. 4, a structure 20 is prepared. Structure 20 may be a plate-shaped element having a predetermined thickness. Structure 20 is able to be formed from a metal plate by, for example, punching processing. A material of structure 20 may be, for example, Cu, a Cu—Fe alloy, or the like. Structure 20 includes a connecting portion 76, first conductor pillars 71, and upper first bypass conductor 41. Connecting portion 76 may have, for example, a rectangular or substantially rectangular shape. Each of first conductor pillars 71 has, for example, a linear shape. Upper first bypass conductor 41 has, for example, an L shape. First conductor pillars 71 and upper first bypass conductor 41 may protrude from connecting portion 76 to both sides. A portion 21 of structure 20 surrounded by a broken line is a portion to be removed in a subsequent step.

Figure 5:
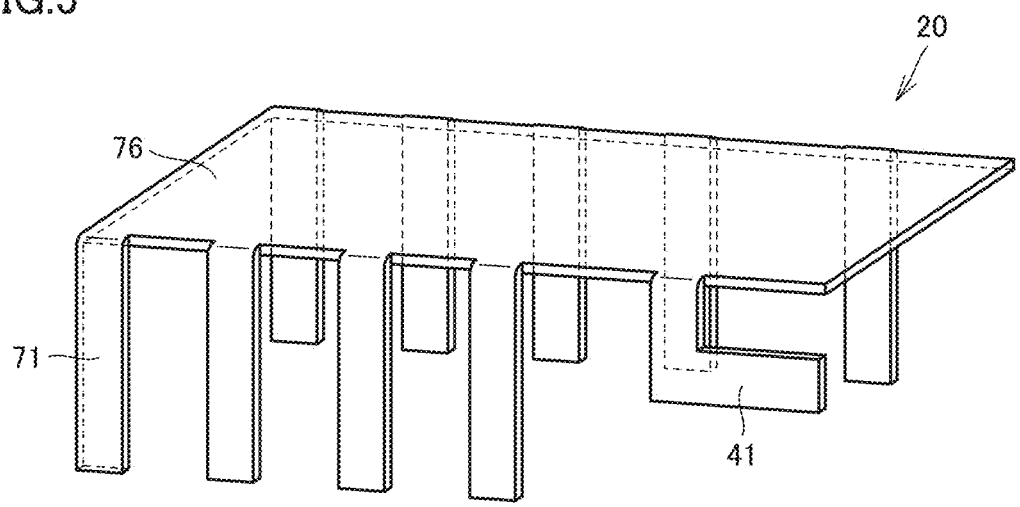
FIG. 5 is a perspective view of the structure included in the method of manufacturing the module according to the first preferred embodiment of the present invention, after the structure is subjected to bending processing.

As shown in FIG. 5, structure 20 is subjected to bending processing. The bending processing causes first conductor pillars 71 and upper first bypass conductor 41 to protrude in a direction perpendicular or substantially perpendicular to connecting portion 76. The punching processing and the bending processing may be separately performed on structure 20, or may be simultaneously performed on structure 20. The example in which first conductor pillars 71 and upper first bypass conductor 41 become perpendicular or substantially perpendicular to connecting portion 76 after bending is described here. However, an angle of bending may be another angle.

Figure 6:
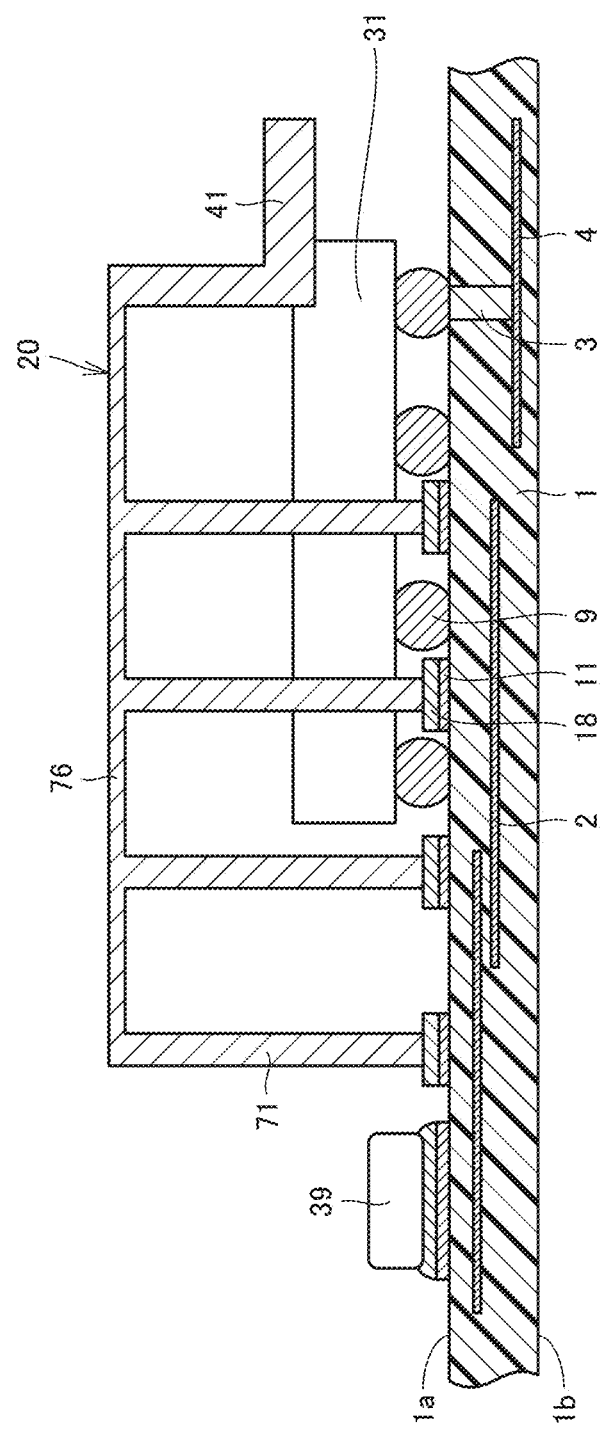
FIG. 6 is an explanatory diagram of a third step of the method of manufacturing the module according to the first preferred embodiment of the present invention.

As shown in FIG. 6, structure 20 subjected to bending processing is mounted on first main surface 1a of substrate 1. For example, structure 20 extends over first component 31. A tip of each of first conductor pillars 71 is electrically connected to first land electrode 11 by solder 18. By connecting portion 76, upper first bypass conductor 41 is maintained at a position spaced apart from first main surface 1a.

Figure 7:
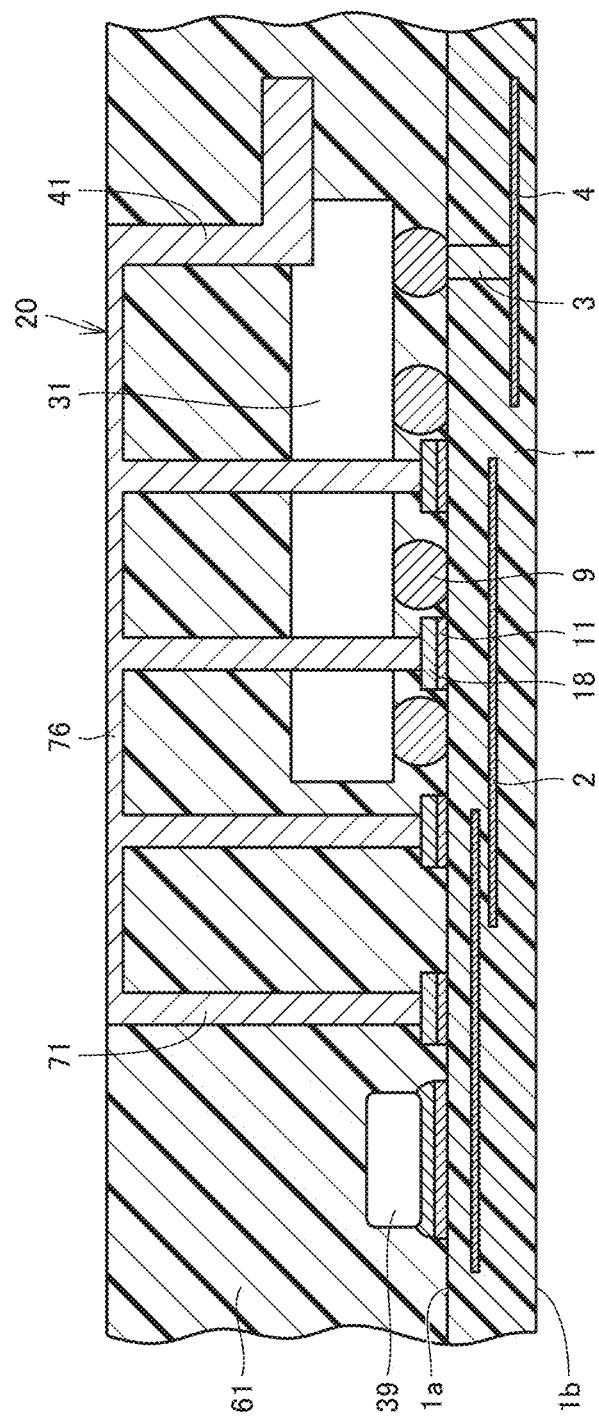
FIG. 7 is an explanatory diagram of a fourth step of the method of manufacturing the module according to the first preferred embodiment of the present invention.

As shown in FIG. 7, first mold resin 61 is formed. First mold resin 61 may be made of, for example, an epoxy resin or the like. First mold resin 61 is able to be formed, for example, by applying a resin and then heating the resin to cure the resin.

In FIG. 7, a top surface of connecting portion 76 and the top surface of first mold resin 61 have the same or substantially the same height. However, the top surface of connecting portion 76 and the top surface of first mold resin 61 may have different heights. The top surface of first mold resin 61 may be at a higher position than the top surface of connecting portion 76, or the top surface of connecting portion 76 may be at a higher position than the top surface of first mold resin 61. However, a difference in height between the top surface of connecting portion 76 and the top surface of first mold resin 61 is preferably not relatively large, for example.

Figure 8:
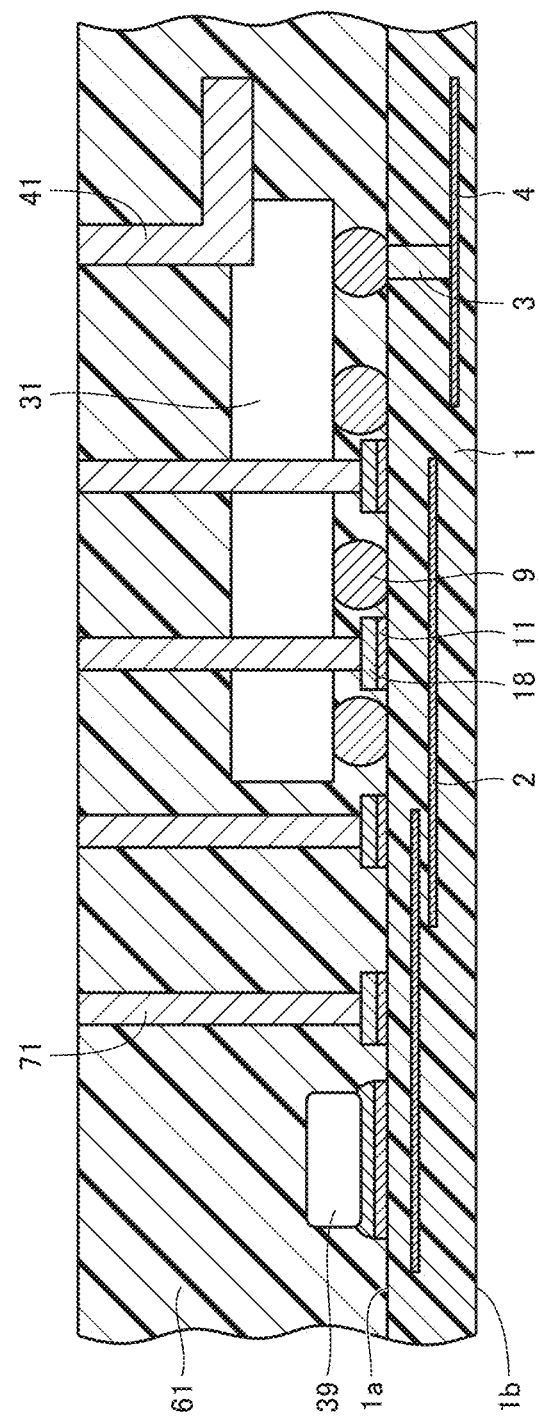
FIG. 8 is an explanatory diagram of a fifth step of the method of manufacturing the module according to the first preferred embodiment of the present invention.
Figure 9:
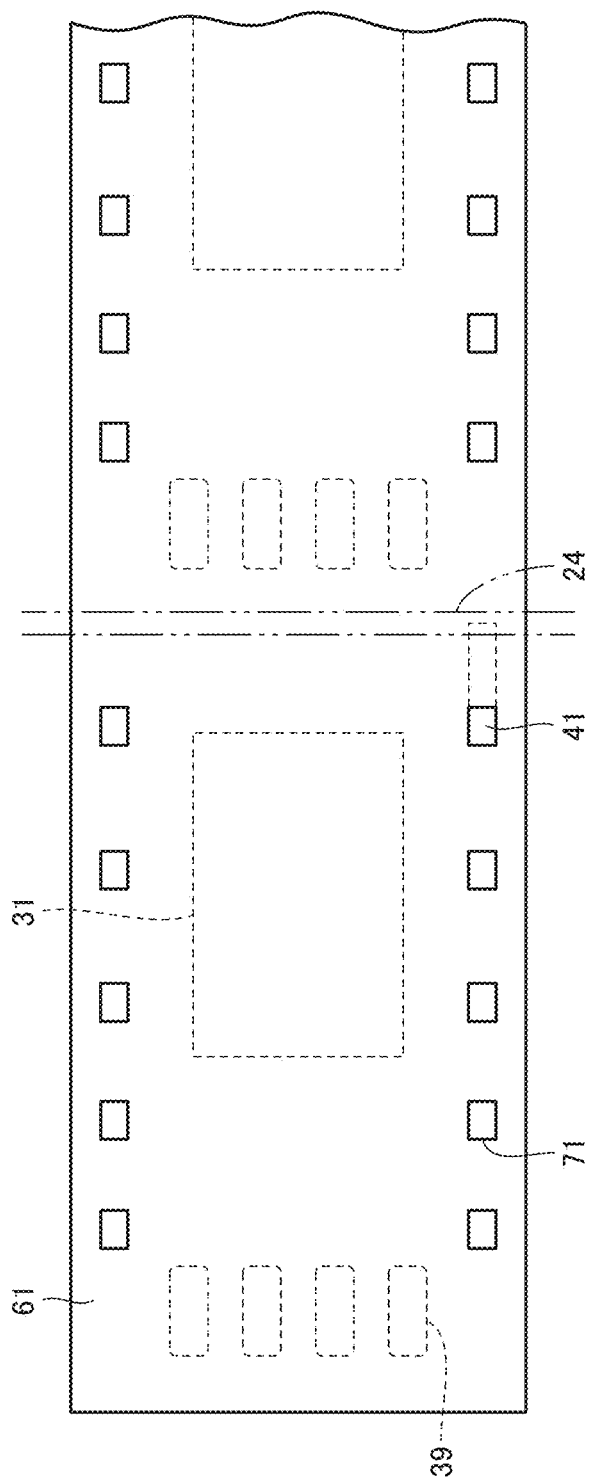
FIG. 9 is a plan view of a state after grinding processing in the fifth step of the method of manufacturing the module according to the first preferred embodiment of the present invention.
Figure 10:
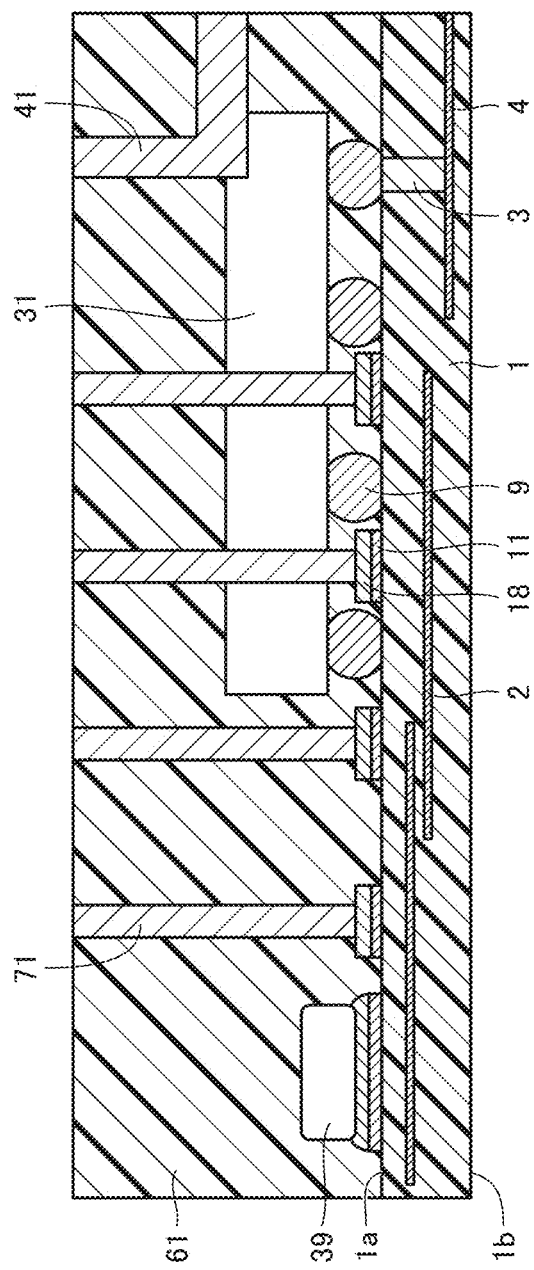
FIG. 10 is an explanatory diagram of a sixth step of the method of manufacturing the module according to the first preferred embodiment of the present invention.

As shown in FIG. 8, the top surface of first mold resin 61 is subjected to grinding processing, for example. As a result of the grinding processing, a portion of structure 20, that is, the entire or substantially the entire connecting portion 76, portions close to upper ends of first conductor pillars 71, and a portion close to an upper end of upper first bypass conductor 41 are removed. The portion removed here corresponds to portion 21 shown in FIG. 4. FIG. 9 shows a plan view of a state after the grinding processing. Top surfaces of first conductor pillars 71 and a top surface of upper first bypass conductor 41 are exposed on the top surface of first mold resin 61. First component 31 and components 39 are covered with first mold resin 61. In FIG. 9, a cutting margin 24 is shown by a two-dot chain line. Cutting margin 24 represents a region removed during cutting by, for example, dicing. Cutting margin 24 corresponds to, for example, a thickness of a dicing blade. In a subsequent step, a left-side module is able to be separated from a right-side module by cutting processing. For the sake of explanation, FIG. 9 shows two continuous modules. Actually, however, the number of continuous modules is not limited to two, and may be larger. The steps so far may be performed in a state of a substrate assembly in which the large number of modules are arrayed in a matrix. Accordingly, the cutting margin is provided in a grid shape. The cutting processing is performed in a grid shape on the substrate assembly, and a plurality of modules are thus able to be produced. FIG. 10 shows a cross-sectional view of a state after the cutting processing into a size of the individual module. An end surface of upper first bypass conductor 41 is exposed on the side surface of first mold resin 61. Furthermore, the end surface of internal GND electrode 4 is exposed on the side surface of substrate 1.

Shield film 5 covers the top surface and the side surface of first mold resin 61 and the side surface of substrate 1. Module 101 shown in FIG. 1 is thus provided. Shield film 5 is a film made of, for example, a conductive material. Shield film 5 is able to be formed by, for example, a vacuum film formation method, such as sputtering or vacuum vapor deposition. Alternatively, shield film 5 may be formed by, for example, a method of printing or applying a conductive paste and then heating the conductive paste to dry the conductive paste. When shield film 5 is formed, top surface shield film 5a and side surface shield film 5b may be formed together. By forming shield film 5, first conductor pillars 71 and top surface shield film 5a are electrically connected to each other, the upper end of upper first bypass conductor 41 and top surface shield film 5a are electrically connected to each other, and a portion of upper first bypass conductor 41 exposed to the side surface and side surface shield film 5b are electrically connected to each other. When internal GND electrode 4 is exposed on the side surface of substrate 1, internal GND electrode 4 and side surface shield film 5b are electrically connected to each other.

Top surface shield film 5a and side surface shield film 5b may be integral and may be directly electrically connected to each other. Depending on the situation, however, top surface shield film 5a and side surface shield film 5b may in some cases be interrupted at a boundary between the top surface and the side surface of first mold resin 61 and separately formed, or electrical connection may in some cases be insufficient even when top surface shield film 5a and side surface shield film 5b are continuous. Even in such a case, sufficient electrical connection between top surface shield film 5a and side surface shield film 5b is able to be provided because first mold resin 61 is provided as described above.

Second Preferred Embodiment

Figure 11:
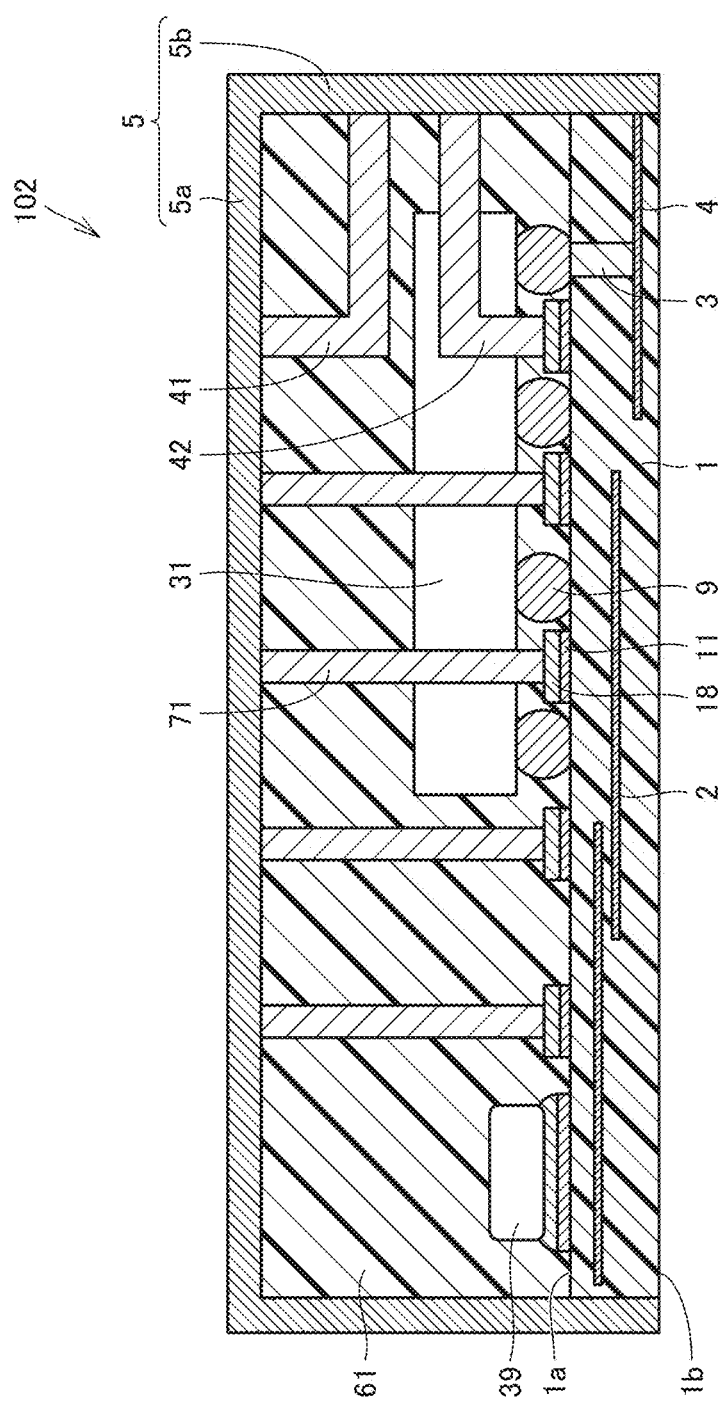
FIG. 11 is a cross-sectional view of a module according to a second preferred embodiment of the present invention.

A module according to a second preferred embodiment of the present invention will be described with reference to FIGS. 11 to 13. FIG. 11 shows a cross-sectional view of a module 102 according to the present preferred embodiment. The basic structures and features of module 102 are the same as or similar to module 101 described in the first preferred embodiment. However, module 102 is different from module 101 described in the first preferred embodiment in the following points.

Module 102 according to the present preferred embodiment includes an upper second bypass conductor 42 provided in first mold resin 61 to connect first land electrode 11 and side surface shield film 5b. Upper second bypass conductor 42 has, for example, an L shape.

Figure 12:
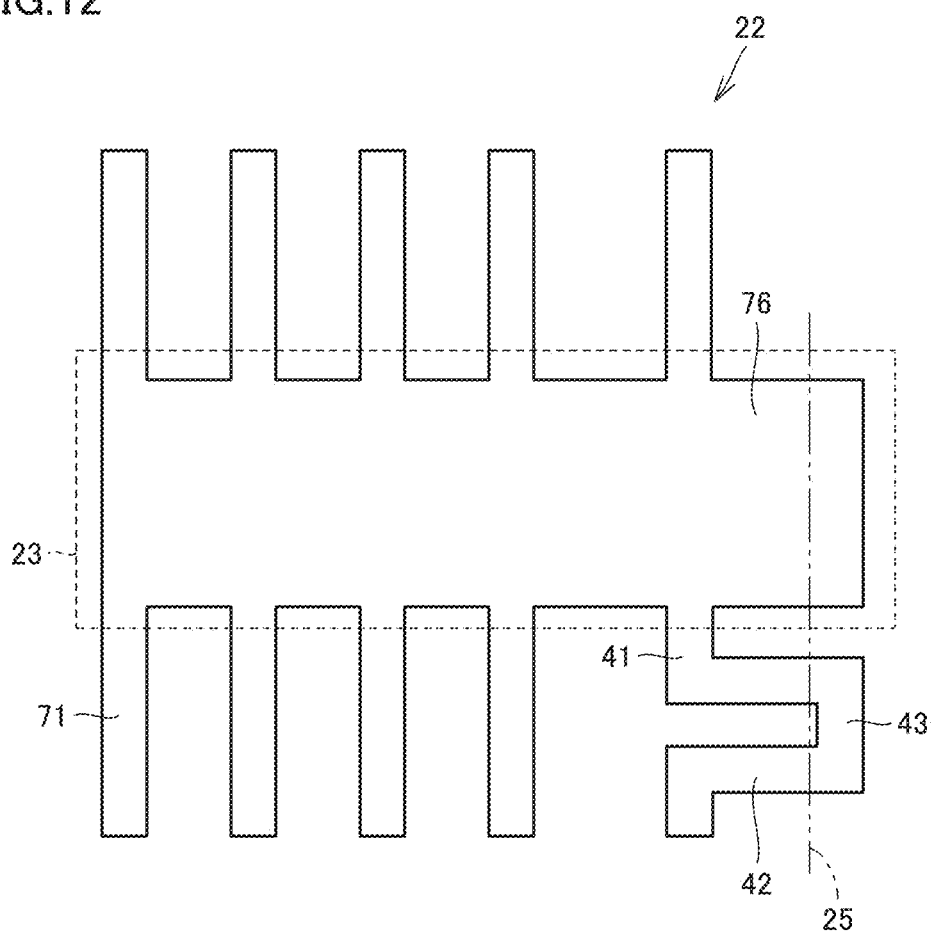
FIG. 12 is a plan view of a structure included in a method of manufacturing the module according to the second preferred embodiment of the present invention.

When module 102 is produced, a structure 22 shown in FIG. 12 may be included instead of structure 20 described in the description of the manufacturing method according to the first preferred embodiment. A material, a manufacturing method, and the like of structure 22 are the same as or similar to those described in the first preferred embodiment. In structure 22, a portion 23 is removed by grinding processing, for example. Structure 22 includes connecting portion 76, first conductor pillars 71, upper first bypass conductor 41, upper second bypass conductor 42, and a portion 43. Upper first bypass conductor 41, upper second bypass conductor 42, and portion 43 are integrally provided. Portion 43 is provided between upper first bypass conductor 41 and upper second bypass conductor 42. A portion on the right side relative to a cutting line 25 is removed by, for example, dicing in a subsequent step. That is, portion 43 is removed in the subsequent step.

Figure 13:
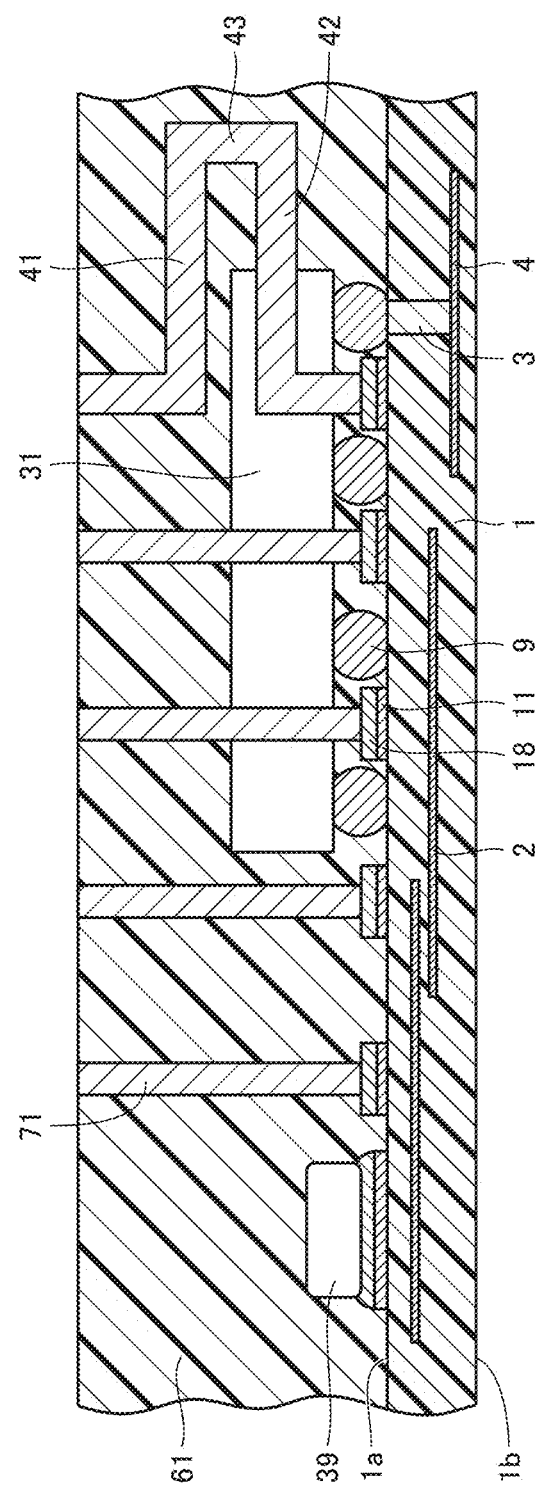
FIG. 13 is a cross-sectional view in a halfway stage of the method of manufacturing the module according to the second preferred embodiment of the present invention.

FIG. 13 shows a state after structure 22 is mounted on substrate 1 and first mold resin 61 is provided, and then, the top surfaces thereof are subjected to grinding processing, for example. FIG. 13 shows a state of a substrate assembly. From this state, the substrate assembly is cut into an individual size by dicing, and further, shield film 5 is formed. Accordingly, module 102 shown in FIG. 11 is able to be provided.

The present preferred embodiment is able to also provide an advantageous effect the same as or similar to that of the first preferred embodiment. Furthermore, in the present preferred embodiment, module 102 includes upper second bypass conductor 42 that connects first land electrode 11 and side surface shield film 5b. Therefore, by preparing a GND electrode on first main surface 1a of substrate 1, side surface shield film 5b is able to be easily grounded through upper second bypass conductor 42.

Moreover, in the present preferred embodiment, upper second bypass conductor 42 is provided in addition to upper first bypass conductor 41, which results in an increase in contact area between these bypass conductors and the mold resin. As a result, efficient heat conduction between the bypass conductors and the mold resin is provided, and thus, the heat release effect is significantly improved.

Third Preferred Embodiment

Figure 14:
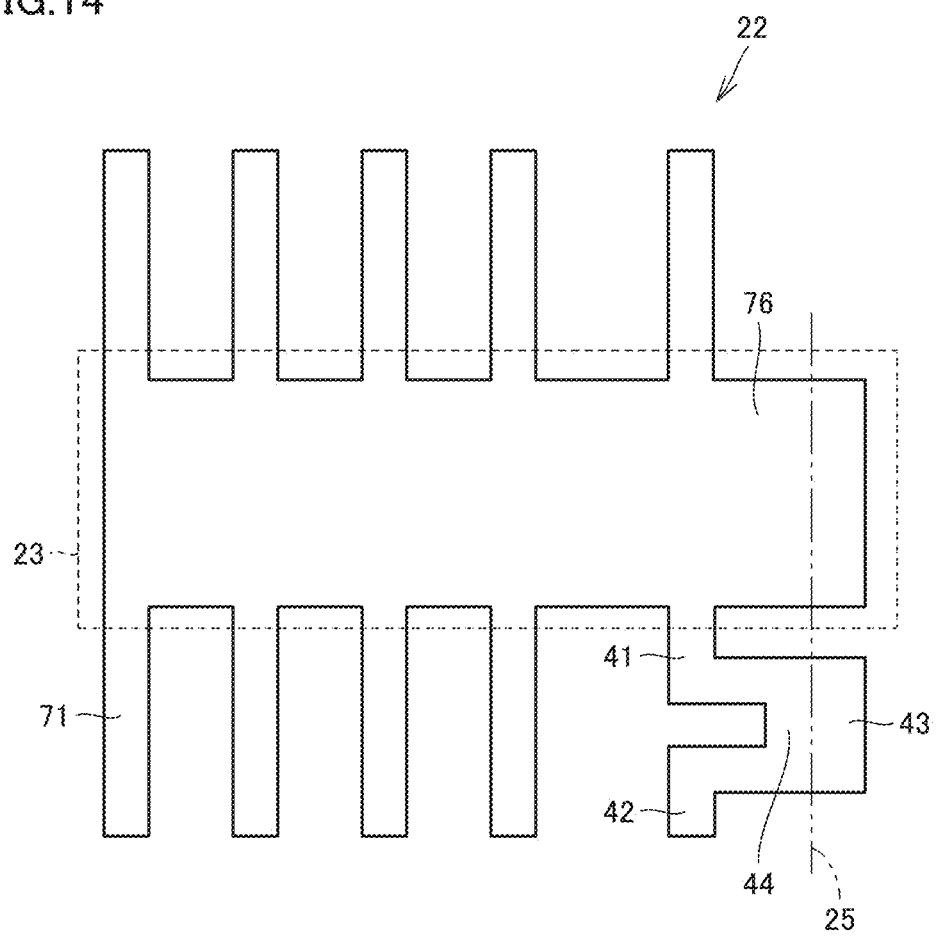
FIG. 14 is a plan view of a structure included in a method of manufacturing a module according to a third preferred embodiment of the present invention.
Figure 15:
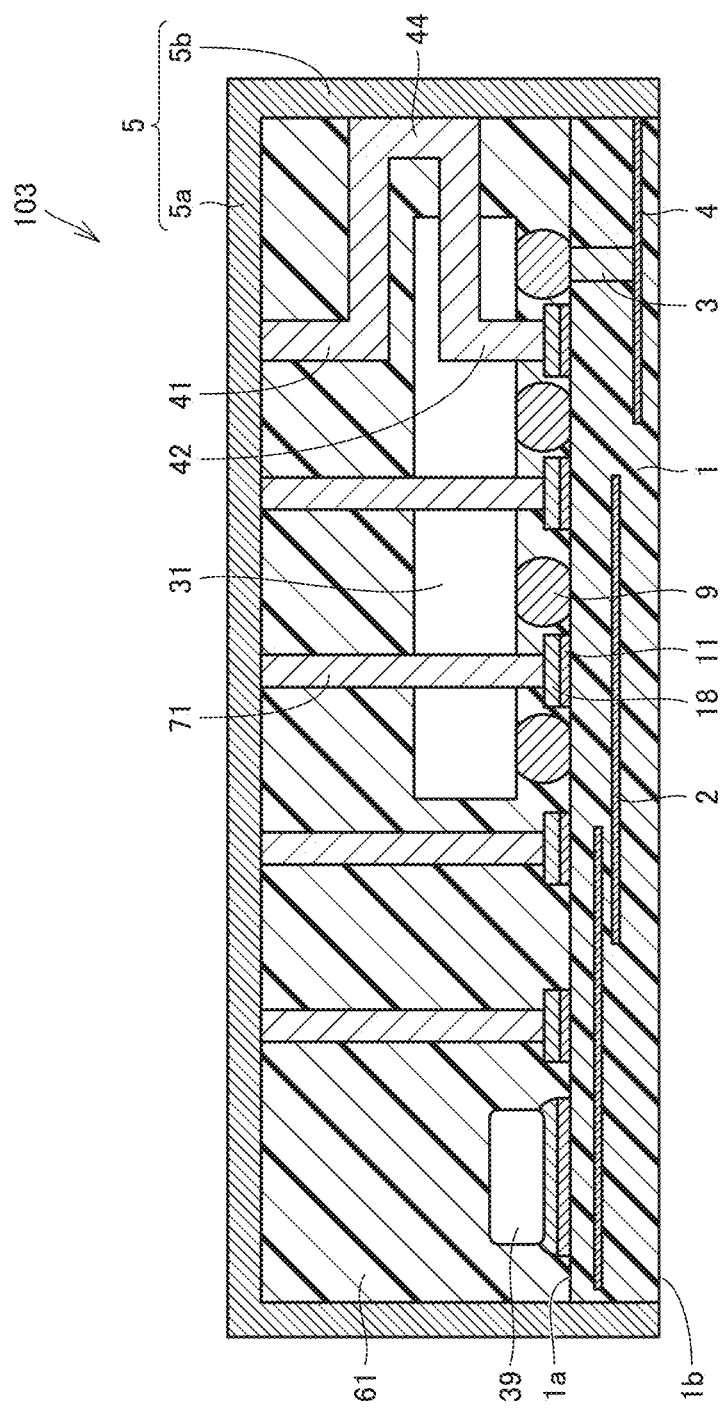
FIG. 15 is a cross-sectional view of the module according to the third preferred embodiment of the present invention.

A module according to a third preferred embodiment of the present invention will be described with reference to FIGS. 14 to 15. In the present preferred embodiment, as shown in FIG. 14, the module is provided by structure 22 including a portion 44. Portion 44 is located adjacent to portion 43. Cutting line 25 also defines and functions as a partition line between portion 43 and portion 44. By using structure 22, a module 103 shown in FIG. 15 is able to be provided. In module 103, portion 44 is provided along side surface shield film 5b. Portion 44 is in contact with side surface shield film 5b.

In the present preferred embodiment, upper first bypass conductor 41 and upper second bypass conductor 42 are integrally provided. Upper first bypass conductor 41 and upper second bypass conductor 42 are connected with portion 44 provided therebetween.

The present preferred embodiment is able to provide an advantageous effect the same as or similar to that of the second preferred embodiment. Furthermore, in the present preferred embodiment, upper first bypass conductor 41 and upper second bypass conductor 42 are integral even in a completed state of module 103. Therefore, a resistance in electrical connection between upper first bypass conductor 41 and upper second bypass conductor 42 is able to be maintained at a relatively low value.

Fourth Preferred Embodiment

Figure 16:
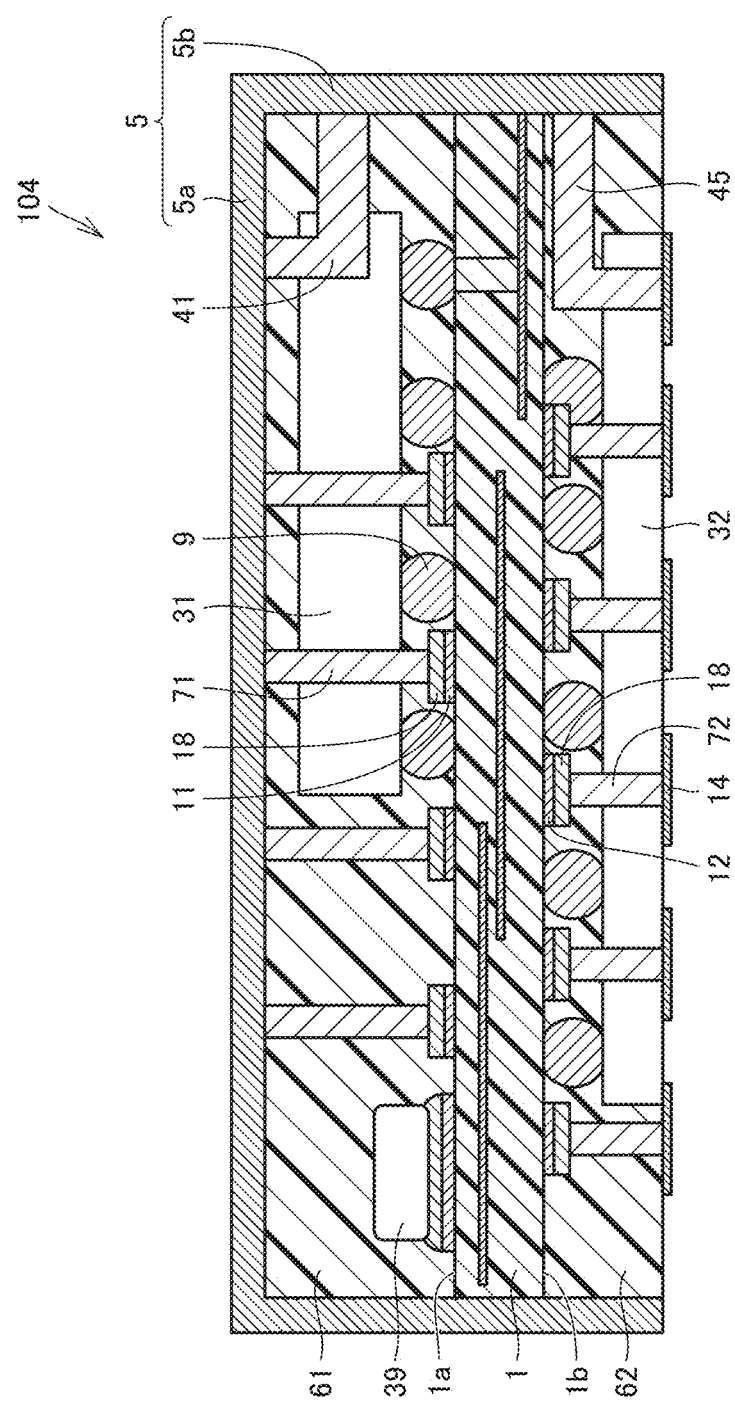
FIG. 16 is a cross-sectional view of a module according to a fourth preferred embodiment of the present invention.

A module according to a fourth preferred embodiment of the present invention will be described with reference to FIG. 16. FIG. 16 shows a cross-sectional view of a module 104 according to the present preferred embodiment. Module 104 is the same as or similar to module 101 described in the first preferred embodiment, and includes further features as described below.

In module 104 according to the present preferred embodiment, substrate 1 includes second main surface 1b on the opposite side of first main surface 1a. Module 104 includes a second component 32 mounted on second main surface 1b, second land electrodes 12 provided on second main surface 1b, a second mold resin 62 that covers at least second main surface 1b and second component 32, land electrodes 14 provided on a bottom surface of second mold resin 62, and second conductor pillars 72 provided in second mold resin 62 to electrically connect second land electrodes 12 and land electrodes 14. Side surface shield film 5b covers the side surface of substrate 1 and a side surface of second mold resin 62. Module 104 includes a lower bypass conductor 45 provided in second mold resin 62 to electrically connect land electrode 14 and side surface shield film 5b.

An upper end of each of second conductor pillars 72 is electrically connected to second land electrode 12 with solder 18 provided therebetween. Lower bypass conductor 45 is spaced apart from second main surface 1b. A bottom surface of second component 32 may be coplanar with a bottom surface of second mold resin 62. That is, the bottom surface of second component 32 is exposed from second mold resin 62. First mold resin 61 and second mold resin 62 may have the same or substantially the same thickness, or may have different thicknesses. A material of second mold resin 62 may be the same as or different from a material of first mold resin 61.

The present preferred embodiment is also able to provide an advantageous effect the same as or similar to that of the first preferred embodiment. Furthermore, lower bypass conductor 45 that electrically connects land electrode 14 and side surface shield film 5b is provided. Therefore, by electrically connecting land electrode 14 and an external GND electrode, side surface shield film 5b is able to be grounded more reliably.

Fifth Preferred Embodiment

Figure 17:
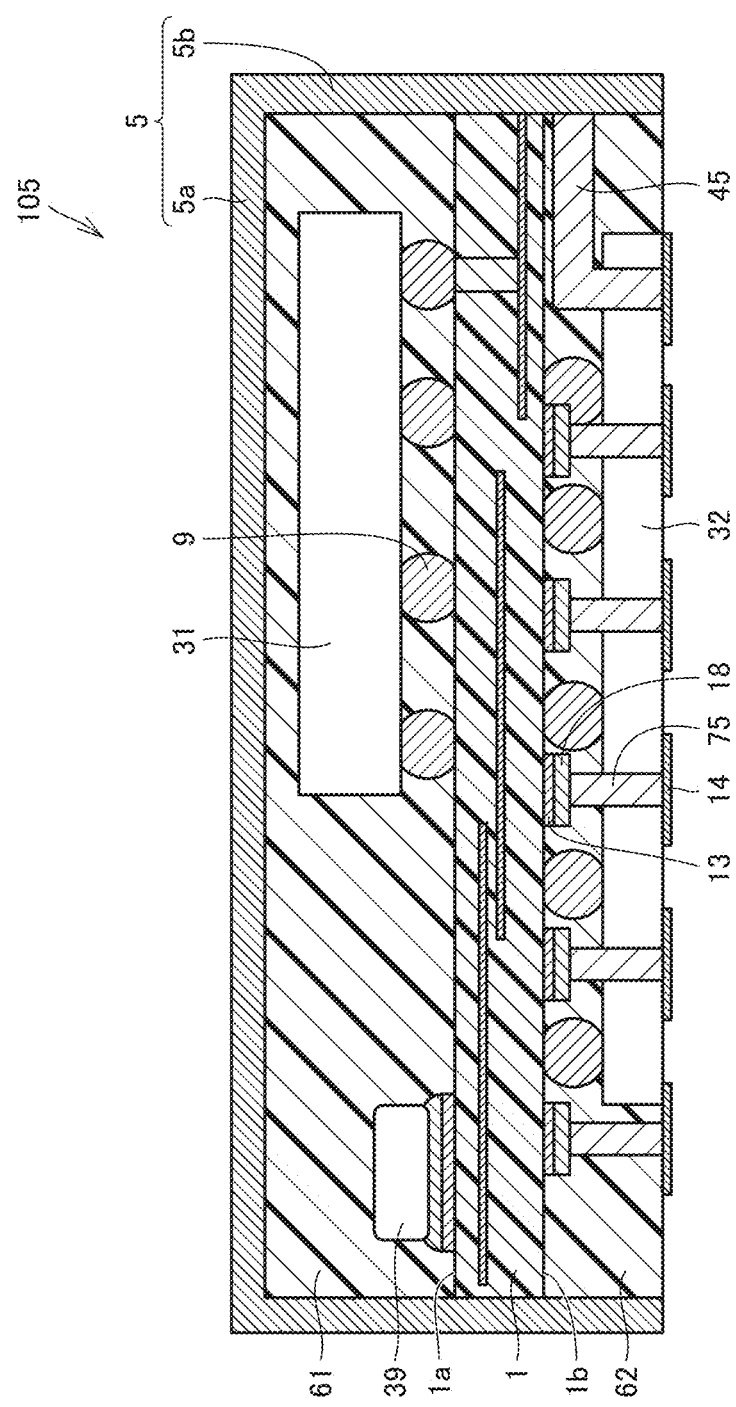
FIG. 17 is a cross-sectional view of a module according to a fifth preferred embodiment of the present invention.

A module according to a fifth preferred embodiment of the present invention will be described with reference to FIG. 17. FIG. 17 shows a cross-sectional view of a module 105 according to the present preferred embodiment.

Although module 105 is similar to module 104 described in the fourth preferred embodiment, module 105 includes features as described below.

Module 105 includes substrate 1 including first main surface 1a and second main surface 1b that faces opposite to first main surface 1a, first component 31 mounted on first main surface 1a, first mold resin 61 that covers at least first main surface 1a and first component 31, second component 32 mounted on second main surface 1b, substrate land electrodes 13 provided on second main surface 1b, second mold resin 62 that covers at least second main surface 1b and second component 32, top surface shield film 5a that covers the top surface of first mold resin 61, side surface shield film 5b that covers the side surface of first mold resin 61, the side surface of substrate 1, and the side surface of second mold resin 62, land electrodes 14 provided on the bottom surface of second mold resin 62, conductor pillars 75 provided in second mold resin 62 to electrically connect substrate land electrodes 13 and land electrodes 14, and lower bypass conductor 45 provided in second mold resin 62 to electrically connect land electrode 14 and side surface shield film 5b. An upper end of each of conductor pillars 75 is electrically connected to substrate land electrode 13 with solder 18 provided therebetween.

In the present preferred embodiment, lower bypass conductor 45 that electrically connects land electrode 14 and side surface shield film 5b is provided. Therefore, by electrically connecting land electrode 14 and an external GND electrode, side surface shield film 5b is able to be reliably grounded. That is, reliable electrical connection for the shield film is able to be provided.

The above-described preferred embodiments may be combined as appropriate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A module comprising:
a substrate including a first main surface;
a first component mounted on the first main surface;
a first land electrode on the first main surface;
a first mold resin that covers at least the first main surface and the first component;
a top surface shield film that covers a top surface of the first mold resin;
a side surface shield film that covers a side surface of the first mold resin;
a first conductor pillar in the first mold resin to electrically connect the first land electrode and the top surface shield film; and
an upper first bypass conductor in the first mold resin to electrically connect the top surface shield film and the side surface shield film.

2. The module according to claim 1, further comprising an upper second bypass conductor in the first mold resin to connect the first land electrode and the side surface shield film.

3. The module according to claim 2, wherein the upper first bypass conductor and the upper second bypass conductor are integrally provided.

4. The module according to claim 1, wherein
the substrate includes a second main surface on an opposite side of the first main surface;
the module further includes:
a second component mounted on the second main surface;
a second land electrode on the second main surface;
a second mold resin that covers at least the second main surface and the second component;
a bottom land electrode on a bottom surface of the second mold resin; and
a second conductor pillar in the second mold resin to electrically connect the second land electrode and the bottom land electrode;
the side surface shield film covers a side surface of the substrate and a side surface of the second mold resin; and
the module further includes a lower bypass conductor in the second mold resin to electrically connect the bottom land electrode and the side surface shield film.

5. The module according to claim 4, wherein the second component is a surface mount device.

6. The module according to claim 1, wherein at least one solder ball or solder bump is provided on the first main surface.

7. The module according to claim 1, wherein the substrate is a multilayer substrate that includes internal conductor patterns.

8. The module according to claim 1, wherein the substrate is a resin multilayer substrate or a ceramic multilayer substrate.

9. The module according to claim 1, wherein the substrate includes an internal ground electrode that is electrically connected to the side surface shield film.

10. The module according to claim 1, wherein the first component is a power amplifier, a low noise amplifier, a switching integrated circuit, a high-frequency integrated circuit, a baseband integrated circuit, or a surface acoustic wave filter.

11. The module according to claim 1, wherein the first component is solder mounted or wire-bond mounted on the first main surface.

12. The module according to claim 1, wherein the upper first bypass conductor has a plate shape.

13. The module according to claim 1, wherein the upper first bypass conductor is spaced apart from the first main surface.

14. The module according to claim 1, wherein a distance between the first component and the upper first bypass conductor is shorter than a distance between the first component and either of the top surface shield film and the side surface shield film.

15. A module comprising:
a substrate including a first main surface and a second main surface that faces opposite to the first main surface;
a first component mounted on the first main surface;
a first mold resin that covers at least the first main surface and the first component;
a second component mounted on the second main surface;
a substrate land electrode on the second main surface;
a second mold resin that covers at least the second main surface and the second component;
a top surface shield film that covers a top surface of the first mold resin;
a side surface shield film that covers a side surface of the first mold resin, a side surface of the substrate, and a side surface of the second mold resin;
a bottom land electrode on a bottom surface of the second mold resin;

a conductor pillar in the second mold resin to electrically connect the substrate land electrode and the bottom land electrode; and a lower bypass conductor in the second mold resin to electrically connect the bottom land electrode and the side surface shield film.

\* \* \* \* \*